United States Patent [19]
Fulks

[11] Patent Number: 5,486,939
[45] Date of Patent: Jan. 23, 1996

[54] THIN-FILM STRUCTURE WITH INSULATING AND SMOOTHING LAYERS BETWEEN CROSSING CONDUCTIVE LINES

[75] Inventor: Ronald T. Fulks, Mountain View, Calif.

[73] Assignee: Xerox Corporation, Stamford, Conn.

[21] Appl. No.: 234,885

[22] Filed: Apr. 28, 1994

[51] Int. Cl.$^6$ ............................ G02F 1/1333; H01L 23/48
[52] U.S. Cl. .................. 359/74; 359/79; 257/760
[58] Field of Search .................. 359/74, 79; 257/503, 257/758, 760

[56] References Cited

U.S. PATENT DOCUMENTS

| | | | |
|---|---|---|---|
| 4,844,587 | 7/1989 | Morin et al. | 359/74 |
| 5,062,690 | 11/1991 | Whetten | 359/59 |
| 5,076,666 | 12/1991 | Katayama et al. | 359/59 |
| 5,151,807 | 9/1992 | Katayama et al. | 359/59 |
| 5,237,436 | 8/1993 | Khan et al. | 359/54 |
| 5,303,074 | 4/1994 | Salisbury | 359/59 |

FOREIGN PATENT DOCUMENTS

| | | | |
|---|---|---|---|
| 60-132344 | 7/1985 | Japan | 257/760 |
| 60-262443 | 12/1985 | Japan | 257/760 |
| 63-15457 | 1/1988 | Japan . | |
| 2-144940 | 6/1990 | Japan | 257/760 |
| 2-234134 | 9/1990 | Japan | 359/79 |

OTHER PUBLICATIONS

Martin, R., Chuang, T., Steemers, H., Allen, R., Fulks, R. Stuber, S., Lee, D., Young, M., Ho, J., Nguyen, M., Meuli, W., Fiske, T., Bruce, R., Thompson, M., Tilton, M., and Silverstein, L. D., "P-70: A 6.3-Mpixel AMLCD," *SID 93 Digest*, 1993, pp. 704–707.

*Primary Examiner*—William L. Sikes
*Assistant Examiner*—Charles Miller

[57] ABSTRACT

A thin-film structure includes conductive lines that cross in a crossover region. A first insulating layer covers the lower conductive line. A second insulating layer is sufficiently thick to isolate signals in the lines and to prevent coupling. Each of the lower conductive line and the second insulating layer can have an edge. A smoothing layer is formed over the edges so that the upper conductive line forms continuously, providing an electrical connection between two points on opposite sides of the edges. The insulating layers can be nitride, separated by an undoped layer of amorphous silicon, so that the same layer sequence can be used as in a thin-film transistor. The smoothing layer can be n+ doped amorphous silicon. The conductive lines can be scan and data lines in an AMLCD or other array.

25 Claims, 7 Drawing Sheets

5,486,939

THIN-FILM STRUCTURE WITH INSULATING AND SMOOTHING LAYERS BETWEEN CROSSING CONDUCTIVE LINES

BACKGROUND OF THE INVENTION

The present invention relates to thin-film structures.

Whetten, U.S. Pat. No. 5,062,690, describes a liquid crystal display with scan lines and data lines. Col. 2 lines 5–27 describe how short circuits between data lines and scan lines are sources of defects and how scan and data lines are insulated from each other at their crossover locations by a thin layer of an insulation material, such as silicon nitride (SiN). The data and scan lines can short to one another at the crossover locations through holes that may inadvertently develop in the insulation layer during device fabrication. Typically, metallization for the data and scan lines is deposited by sputtering during different process steps, so that the later deposited metallization will be deposited through any holes or openings in the insulation layer formed in contact with the first deposited metallization. As shown and described in relation to FIG. 2, scan lines and data lines are electrically isolated by a layer of insulation, preferably SiN; since the process steps of field-effect transistors (FETs) require a "sandwich" structure of SiN, amorphous silicon (a-Si) and doped a-Si, a layer of a-Si and a layer of doped a-Si may also be deposited between the scan and data lines. Col. 5 lines 11–33 describe deposition of a layer of hydrogenated silicon nitride, a layer of hydrogenated amorphous silicon, and a heavily doped layer of hydrogenated amorphous silicon, which can be an N+ layer.

As shown and described in relation to FIGS. 6A–9B, each scan and data line crossover location can have a redundant crossover with an open circuit that may be closed by a laser-fusible link to create a shunt around the crossover location if the scan and data lines are shorted. The crossover location may be electrically isolated by severing the scan line and data line at locations between points where the redundant crossovers connect. Col. 8 lines 9–17 mentions that metallization thicker than 200 angstroms could be used, but then there is a risk of step coverage problems when subsequent layers of materials are deposited over the first metallization pattern.

Col. 8 lines 38–46 mentions that the insulation layer may be about 500–1500 angstroms thick, with a thicker layer increasing voltage required to turn on FETs and a thinner layer increasing probability of defects within FETs or between scan and data lines at crossovers. Patterns of the insulation layer of SiN and layers of a-Si on it are shown and described in relation to FIG. 7B.

SUMMARY OF THE INVENTION

The invention is based m the discovery of a new technique for producing a thin-film structure at a surface of a substrate.

The new technique applies to a thin-film structure with a first conductive line and a second conductive line that crosses over the first in a crossover region. The crossover region is between connecting points at which the second conductive line connects to leads. A first insulating layer is between the second conductive line and the substrate and is also between the two conductive lines in the crossover region, covering the first conductive line. As a result of this arrangement, the first conductive line has an edge between the connecting points, which can result in a problem with continuity of the second conductive line.

To ensure continuity, the new technique provides a smoothing layer under the second conductive line between the connecting points. The smoothing layer is between the first insulating layer and the second conductive line in the crossover region, and has an outer surface shaped so that the second conductive line is continuously formed over the edge of the first conductive line. As a result, the second conductive line electrically connects the leads to which it connects at the connecting points.

The new technique can also provide a second insulating layer in the crossover region to ensure that the conductive lines are isolated and do not couple. If so, the second insulating layer also has an edge between the connecting points, which can result in a problem with continuity of the second conductive line. This edge may result, for example, because the second insulating layer is produced using a backside exposure process, so that its edge is approximately aligned with the edge of the first conductive line. The smoothing layer can also cover the edge of the second insulating layer so that the second conductive line is also continuously formed over the edge of the second insulating layer.

The smoothing layer itself can extend continuously without an edge between the first and second connecting points. The smoothing layer could, however, be beneficial even if it included an edge-it would cover the edge of the first conductive layer and the second insulating layer, providing smoothing of both edges.

The invention can be implemented in a thin-film structure in which the first conductive line is molybdenum and chromium on an insulating substrate. The first and second insulating layers can each be silicon nitride. The smoothing layer can be amorphous silicon, and can be doped such as with an n+ dopant. If the substrate is Corning 7059 Glass, doped amorphous silicon will have approximately the same coefficient of thermal expansion as the substrate. The second conductive line can include a layer of conductive metal such as aluminum and a layer of barrier metal such as chromium or titanium-tungsten to prevent the aluminum from diffusing into the smoothing layer. An undoped layer of amorphous silicon can separate the first and second insulating layers, so that the sequence of layers in the crossover region is the same as in a thin-film transistor (TFT) elsewhere on the substrate. The second insulating layer can have approximately the widths of the first and second conductive lines, but with edges slightly offset from their edges.

The thin-film structure can include an array of light control units for causing presentation of images, such as for an active matrix liquid crystal display (AMLCD). First and second sets of conductive lines can connect to scan leads and drive leads of the light control units to provide scan and drive signals in response to which each light control control unit causes presentation of a segment of images presented. Each of the second set of conductive lines can cross each of the first set in a crossover region in which they are separated by an insulating layer and a smoothing layer as described above. Each light control unit can include a TFT with its gate lead receiving the scan signal and its source lead receiving the drive signal, so that each of the first set of conductive lines can connect to a row of light control units and each of the second set can connect to a column.

The technique can be implemented by a method that first produces the first conductive line and then the first insulating layer. The method also produces the smoothing layer, followed by a metal layer over the smoothing layer. Then the method performs lithography to form a pattern of mask material with a conductive line's shape and etches areas not covered by the pattern to produce the second conductive line, which is continuously formed over the edge of the first conductive line so that it electrically connects points on opposite sides of the edge.

The method can also form a pattern in the smoothing layer after producing the second conductive line, by etching to remove areas of the smoothing layer that are not covered by the second conductive line. The smoothing layer can be a layer of n+ doped amorphous silicon, which can be the layer of the TFT that provides source and drain leads. The smoothing layer can be deposited by plasma enhanced chemical vapor deposition.

The new technique described above is advantageous because it greatly improves yield in an AMLCD or similar array. The technique has been used, for example, to successfully produce an array with 6.3 million light control units, a diagonal dimension of approximately 33 centimeters (cm) and an area of approximately 510 $cm^2$. The new technique provides satisfactory crossovers because the outer surface shape of the smoothing layer allows the second upper metal line to form continuously despite edges in the layers below.

The new technique can be efficiently implemented because it does not require additional process steps. The sequence of layers in crossover regions can be the same as in TFTs. The top metal layer can be used as a mask in etching the smoothing layer to isolate components of TFTs.

The following description, the drawings, and the claims further set forth these and other aspects, objects, features, and advantages of the invention.

DETAILED DESCRIPTION

A. Conceptual Framework

Figure 1:
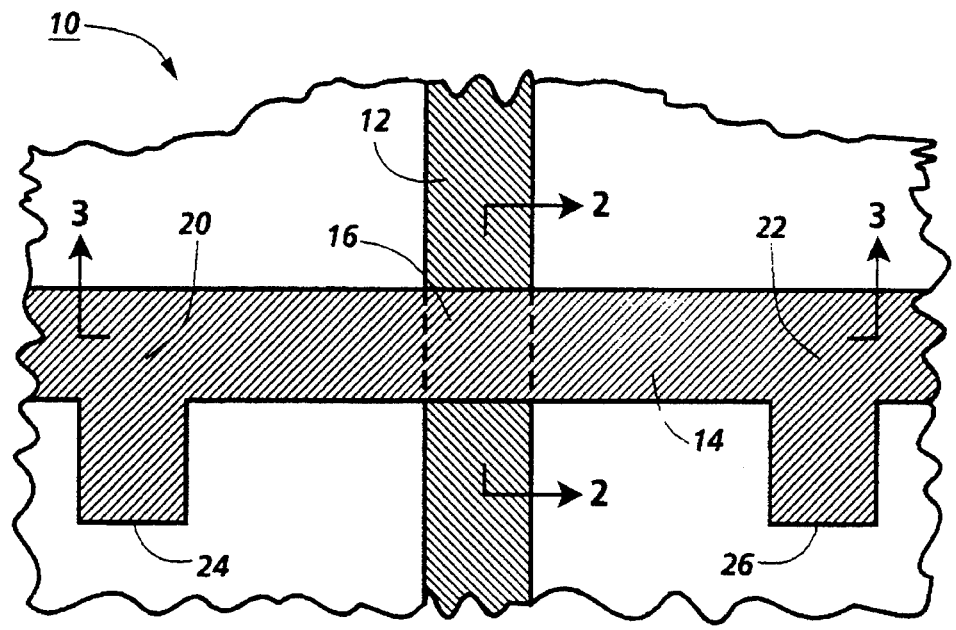
FIG. 1 is a schematic partial plan view showing a product with a thin-film structure in which two crossing conductive lines are separated by first and second insulating layers and by a smoothing layer.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the second signal includes information from the first signal. Circuitry "stores" a first signal when it receives the first signal at one time and, in response, provides the second signal at another time. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other.

A "substrate" or "chip" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material. To "wet etch" is to etch using liquid chemical reactions. To "dry etch" is to use gas-phase reactants, inert or active ionic species, or a mixture of these to etch by chemical processes, physical processes, or a mixture of these, respectively.

To perform "physical vapor deposition" is to cause a material to be deposited on a physical structure without a chemical reaction. Examples include sputtering, vacuum evaporation, and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" uses a plasma energy source.

To perform "lithography" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" if it is to be used for etching.

A "thin-film structure" is a physical structure that is formed from layers of material at a surface of a substrate. A thin-film structure could be formed, for example, by deposition and patterned etching of films on the substrate's surface.

During production of a thin-film structure at a surface, a part of a first layer "covers" or "has a shape that covers" or "is over" a part of a second layer if the part of the second layer is between the part of the first layer and the surface. Similarly, a part of a first layer "extends across" a part of a second layer if the part of the first layer covers the part of the second layer.

An "integrated circuit" is a circuit formed at a substrate's surface by batch processes such as deposition, lithography, etching, oxidation, diffusion, implantation, annealing, and so forth.

A "lead" is a part of component at which the component is electrically connected to other components. A "conductive line" or "line" is a simple conductive component that extends between and electrically connects two or more leads. A lead of a component is "connected" to a lead of another component when the two leads are electrically connected by a combination of leads and lines. In an integrated circuit, leads of two components may also be "connected" by being formed as a single lead that is part of both components.

A conductive line in a thin-film structure formed at a surface is "formed on" the surface if the thin-film structure does not include any layers between the conductive line and the surface.

During production of a thin-film structure, a part of a layer is "shaped like a conductive line" if the part is shaped so that it could extend between and electrically connect two or more leads of components in the completed thin-film structure.

In a thin-film structure, a second conductive line "crosses over" a first conductive line if there is a region, referred to as a "crossover region," in which the first conductive line is between the second conductive line and the surface of the substrate at which the thin-film structure is formed.

In a thin-film structure, an "insulating layer" is a layer formed of a non-conductive material.

Where an insulating layer is between two conductive lines, the insulating layer is "sufficiently thick" that signals in the conductive lines are isolated from each other and do not couple if the insulating layer, when taken with any other layers between the conductive lines, has a thickness such that signals do not couple, capacitively or otherwise, and such that there are no shorts between the conductive lines.

In a thin-film structure, a conductive layer or line is "continuously formed" in a region if the layer or line can electrically connect components across by the region.

In a thin-film structure, a part of a layer "has an edge" if another, complementary part of the layer has been removed by one or more processes, leaving the part of the layer. The edge is the boundary between part of a layer and its complementary part. Conversely, a layer extends "continuously without an edge" in a region if no part of the layer has been removed from the region. A "width" of a part of a layer such as a line is a distance between two edges.

In a thin-film structure, a "smoothing layer" is a layer of material that provides an outer surface shaped so that another layer can be continuously formed over the smoothing layer. If, for example, the smoothing layer is formed over an edge in a lower layer, a conductive layer or line above the smoothing layer may, as a result, be continuously formed over the edge.

Edges of two layers or parts of layers in a thin-film structure are "approximately aligned" if their projections onto the surface of the substrate at which the thin-film structure is formed are approximately the same.

Edges of two layers or parts of layers are "slightly offset" from each other if their projections onto the surface of the substrate are at slightly different positions.

A "channel" is a part of a component through which electric current can flow. A channel is "conductive" when the channel is in a state in which current can flow through it.

A "channel lead" is a lead that connects to a channel. A channel may, for example, extend between two channel leads.

A "transistor" is a component that has a channel that extends between two channel leads, and that also has a third lead-referred to as a "gate lead" or simply "gate"—such that the channel can be switched between high impedance and low impedance by signals that change potential difference between the gate and one of the channel leads, referred to as the "source." The channel lead that is not the source is referred to as the "drain." Other components may have leads called gates, sources, and drains by analogy to transistors.

A "thin-film transistor" or "TFT" is a transistor that is part of a thin-film structure. The term "thin-film transistor" includes transistors with multiple gates.

An "image" is a pattern of physical light.

When an image is a pattern of physical light in the visible portion of the electromagnetic spectrum, the image can produce human perceptions. The term "graphical feature", or "feature", refers to any human perception produced by, or that could be produced by, an image.

An image may be divided into "segments," each of which is itself an image. A segment of an image may be of any size up to and including the whole image.

"Image output circuitry" is circuitry for providing data defining images as output.

An "image output device" is a device that can provide output defining an image.

"Display circuitry" is circuitry that can receive data defining a sequence of images and present versions of the images in sequence so that a viewer can perceive the versions of the images in sequence. A "display" is an image output device that includes display circuitry. Display circuitry or a display may, for example, include a cathode ray tube; an array of light emitting, reflecting, or absorbing elements; a structure that presents sequences of images on a screen, paper, or another medium; or any other structure capable of presenting sequences of images in response to data that define them. To "present an image" on display circuitry or a display is to operate the display circuitry or display so that a viewer can perceive the image.

A "segment of images" presented by a display is at the same relative position within all the images.

Circuitry or a circuit "causes presentation of a segment" or "presents a segment" of images if the segment is presented in response to the circuitry or circuit.

A "light control unit" is a part of a display that is structured to receive a signal and to respond to its signal by causing presentation of an image segment with one of a set of colors.

An "array of light control units" is an arrangement of light control units that can cause presentation of segments that together form an image. An array of light control units can, for example, extend in first and second directions that are perpendicular, forming rows and columns. A light control unit in an array can respond to first and second signals by presenting a segment, with the first signal, sometimes called a "scan signal," selecting a row of light control units that includes the light control unit and the second signal, sometimes called a "drive signal," driving the column of light control units that includes the light control unit. A light control unit may have a "scan lead" connected to a conductive line from which it receives a scan signal and a "drive lead" connected to a conductive line from which it receives a drive signal.

The "area" of an array of light control units that extends in first and second directions is the product of the array's extent in the first direction and its extent in the second direction. For example, an array the size of an index card that measures 7.5 cm×12.5 cm is 93.75 cm².

A "liquid crystal cell" is an enclosure containing a liquid crystal material.

A "liquid crystal display" or "LCD" is a display that includes a liquid crystal cell with a light transmission characteristic that can be controlled in parts of the cell by an array of light control units to cause presentation of an image. An "active matrix liquid crystal display" or "AMLCD" is a liquid crystal display in which each light control unit has a nonlinear switching element that causes presentation of an image segment by controlling a light transmission characteristic of an adjacent part of the liquid crystal cell. The light control units can, for example, be binary control units.

B. General Features

Figure 2:
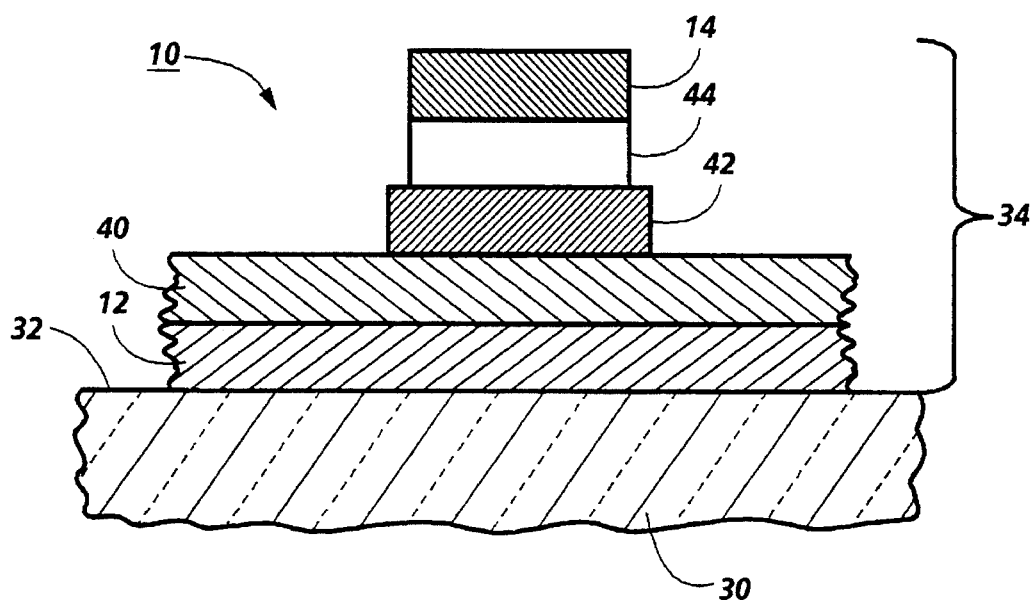
FIG. 2 is a cross-section view along the line 2—2 in FIG. 1.
Figure 3:
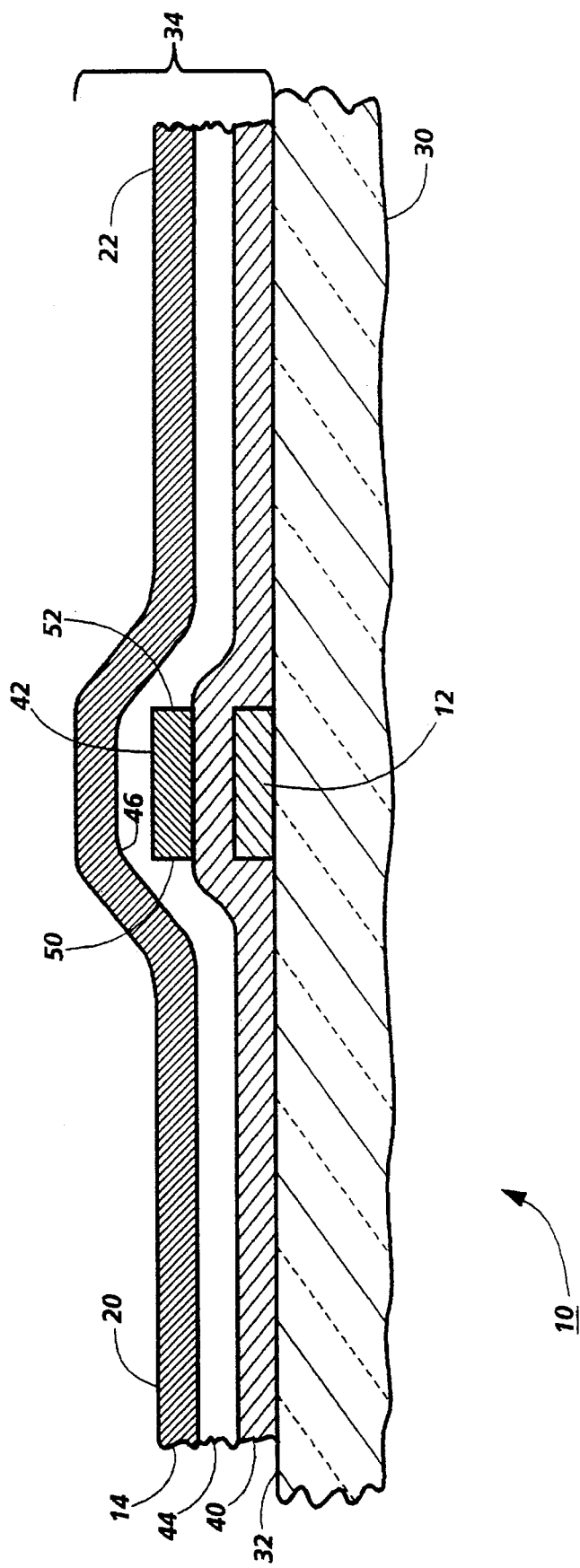
FIG. 3 is a cross-section view along the line 3—3 in FIG. 1.
Figure 4:
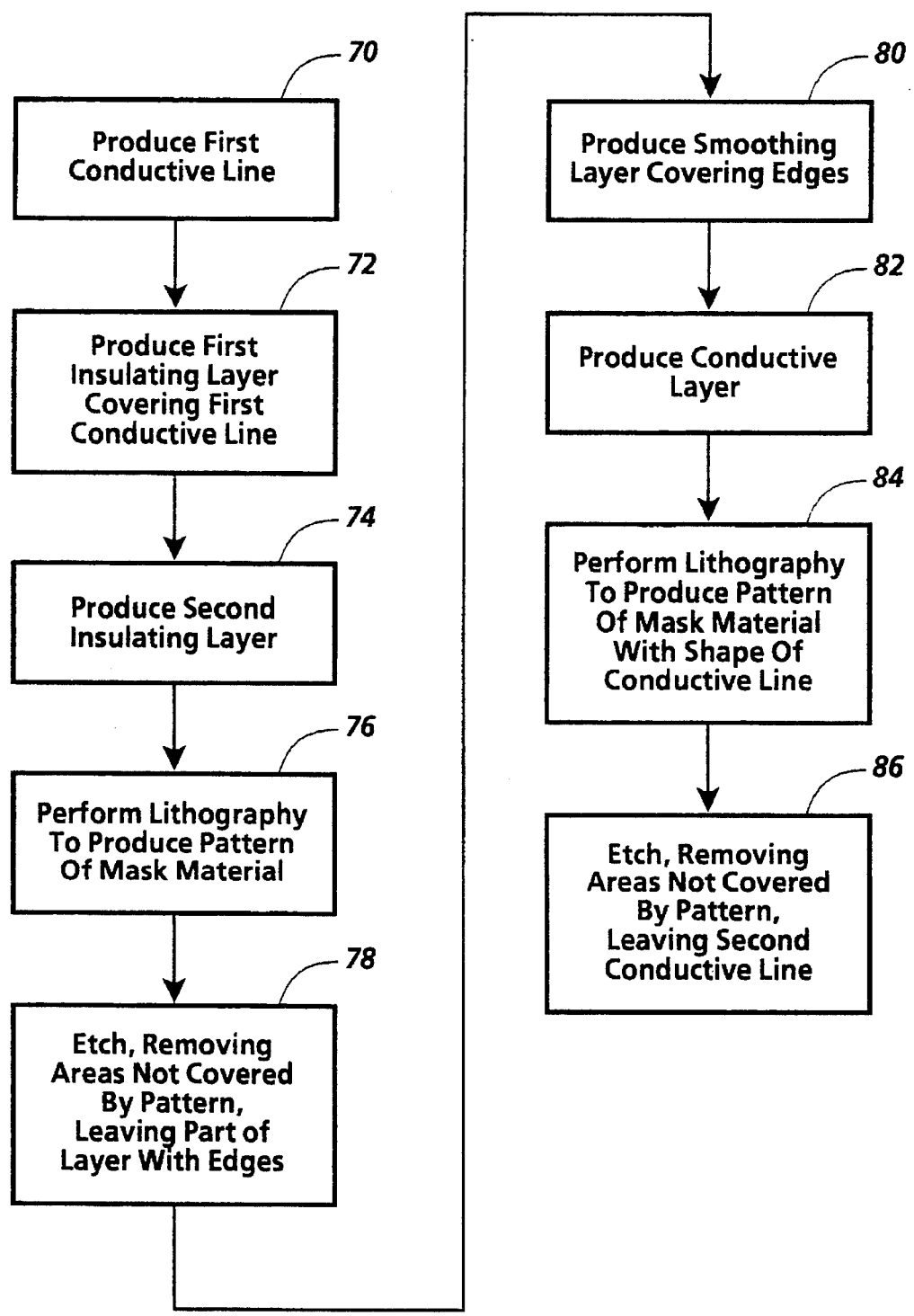
FIG. 4 is a flow chart showing general acts in producing layers as in FIGS. 2 and 3.

FIGS. 1 shows a thin-film structure with two crossing conductive lines that are separated by first and second insulating layers and by a smoothing layer. FIGS. 2 and 3 shows a cross-section views of the crossover region in FIG. 1. FIG. 4 shows general acts in producing layers as in FIGS. 2 and 3.

Product 10, shown in partial plan view in FIG. 1, includes a thin-film structure with conductive lines 12 and 14. Conductive lines 12 and 14 cross in crossover region 16, shown by dashed lines. Within crossover region 16, conductive line 12 is between conductive line 14 and the surface of the substrate at which the thin-film structure is formed.

Conductive line 14 extends between connecting points 20 and 22, at which conductive line 14 connects to leads 24 and 26, respectively, which can be leads of components such as thin-film transistors (TFTs). Therefore, if conductive line 14 is continuously formed between connecting points 20 and 22, it electrically connects leads 24 and 26.

The arrows 2—2 and 3—3 in FIG. 1 show the positions of the cross-sections shown in FIGS. 2 and 3, respectively. The cross-sections in FIGS. 2 and 3 show some, but not necessarily all, layers of the thin-film structure, with the same layers having the same reference numerals.

FIGS. 2 and 3 show cross-sections of product 10, including substrate 30 with surface 32 at which thin-film structure 34 is formed. Thin-film structure 34 includes conductive line 12, which can be metal. Over conductive line 12 are first insulating layer 40, second insulating layer 42, smoothing layer 44, and conductive line 14, which can also be metal. Insulating layer 40 covers conductive line 12, while insulating layer 42 has sufficient thickness that signals in conductive lines 12 and 14 are isolated from each other and do not couple.

As shown in FIG. 3, smoothing layer 44 has outer surface 46 and extends continuously without an edge under conductive line 14 from connecting point 20 to connecting point 22. Second insulating layer 42 has edges 50 and 52, which can be approximately aligned with but slightly offset from edges of conductive line 12 if a backside expose operation is used to produce second insulating layer 42. Outer surface 46 is shaped so that conductive line 14 is continuously formed over the edges of conductive line 12 in crossover region 16 and also over edges 50 and 52. As a result, conductive line 14 electrically connects connecting points 20 and 22, and therefore leads 24 and 26 in FIG. 1.

As shown in FIG. 4, the act in box 70 begins by producing a first conductive line. The act in box 72 then produce a first insulating layer that is wider than the first conductive line and therefore covers it.

The act in box 74 produces a second insulating layer of sufficient thickness to isolate signals and prevent coupling. The act in box 76 performs lithography to produce a pattern of mask material that covers a part of the second insulating layer that has a shape that covers an isolation region of the first conductive line, which is the crossover region. The act in box 78 then etches to remove areas of the second insulating layer not covered by the pattern of mask material from box 76, leaving a part of the second insulating layer that has edges. If a backside expose operation is also performed in producing the second insulating layer, as in producing a self-aligned TFT, the edges of the second insulating layer that extend parallel to the first conductive line are approximately aligned with but slightly offset from the edges of the first conductive line.

The act in box 80 produces a smoothing layer with an outer surface shaped so that a conductive layer can be continuously formed over the edges of the first conductive line and the second insulating layer. The act in box 82 then produces a conductive layer that is continuously formed over the outer surface of the smoothing layer, and therefore over the edges of the first conductive line and the second insulating layer. The act in box 84 performs lithography to produce a pattern of mask material that covers a part of the conductive layer having the shape of a conductive line extending between two connecting points. The line-shaped part extends across the part of the second insulating layer from box 78 and across its edges. The act in box 86 then etches to remove areas of the conductive layer not covered by the pattern of mask material from box 84. As a result of the etch in box 86, the line-shaped part of the conductive layer forms a second conductive line that crosses the first conductive line in the isolation region and electrically connects the connecting points.

C. Implementation

The general features described above could be implemented in numerous ways to provide a thin-film structure with crossing conductive lines separated by an insulating layer and a smoothing layer that covers an edge of the lower conductive line. As described below, the general features have been implemented in a number of ways. A product that includes crossing conductive lines according to one of the implementations described below is also described in Martin, R., Chuang, T., Steemers, H., Allen, R., Fulks, R., Stuber, S., Lee, D., Young, M., Ho, J., Nguyen, M., Meuli, W., Fiske, T., Bruce, R., Thompson, M., Milton, M., and Silverstein, L.D., "P-70: A 6.3-Mpixel AMLCD," SID 93 Digest, 1993, pp. 704–707.

C.1. Array

Figure 5:
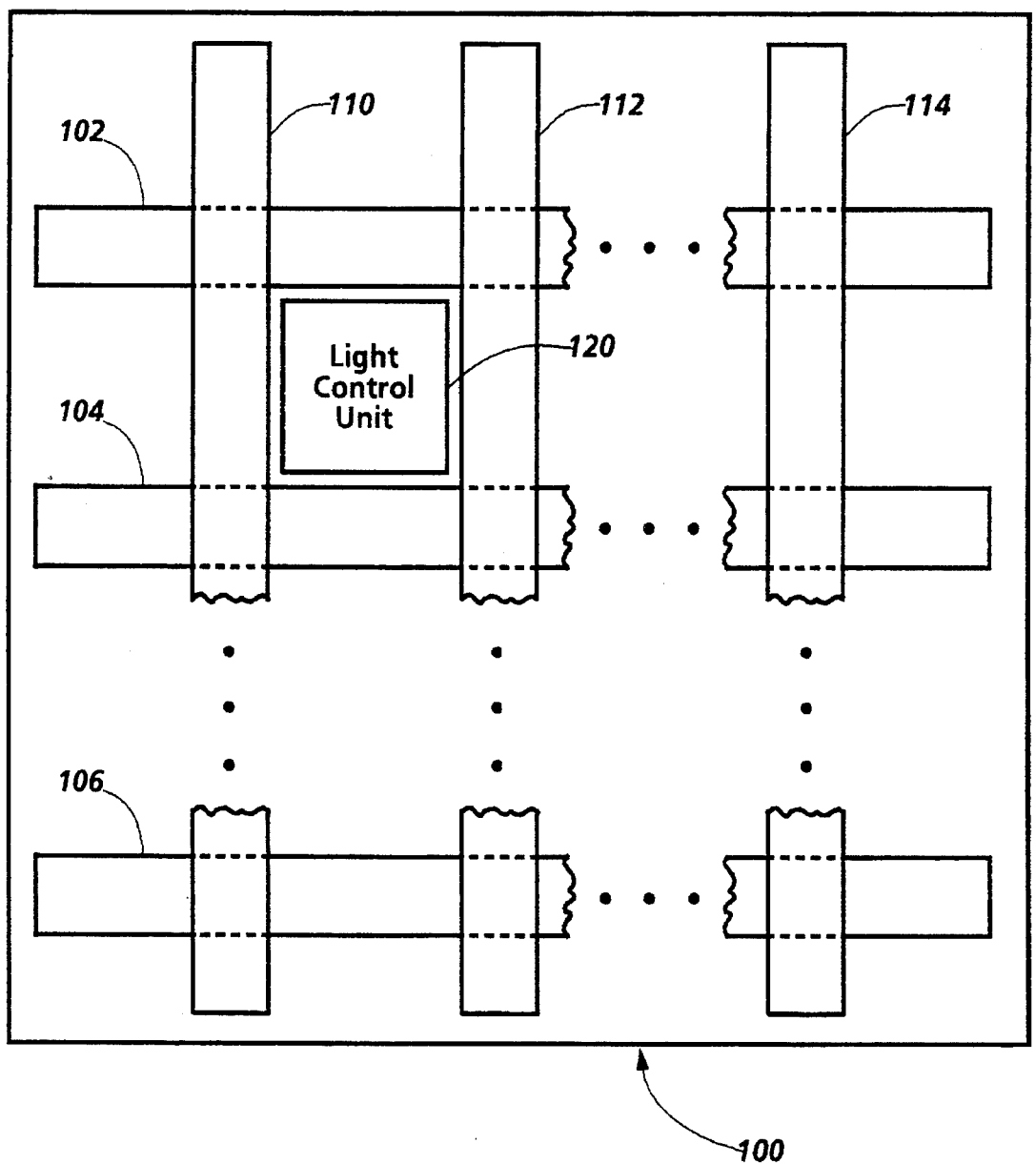
FIG. 5 is a schematic plan view of an array with conductive lines that cross and are separated by first and second insulating layers and by a smoothing layer.
Figure 6:
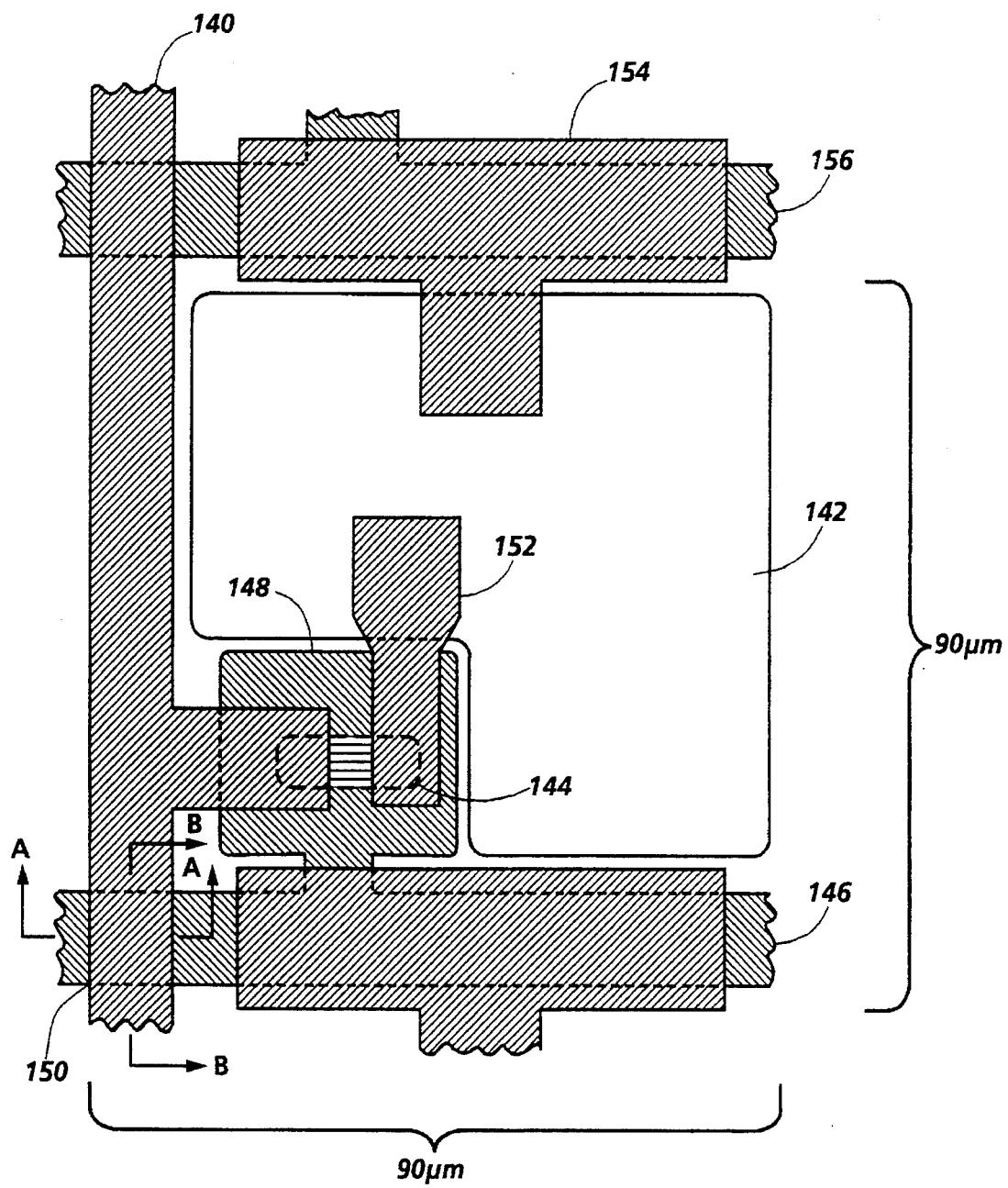
FIG. 6 is a schematic plain view of a light control unit in the array of FIG. 5.

FIG. 5 shows a partial layout of an array with crossing conductive lines as described above. FIG. 6 shows a layout of a light control unit in the array of FIG. 5.

Array 100 in FIG. 3 includes scan lines 102, 104, through 106 and data lines 110, 112, through 114. Scan lines 102, 104, through 106 are conductive lines, with scan lines 104 through 106 each connected to a row of light control units to provide a signal selecting the light control units in that row. Similarly data lines 110, 112, through 114 are conductive lines, each connected to a column of light control units to provide data to the light control units in that column. Illustrative light control unit 120, for example, receives its scan signal from scan line 104 and its data signal from data line 110.

In general, each light control unit in array 100 receives a binary signal from its data line, so that the light control unit is driven either in its fully ON saturation state or in its fully OFF saturation state, as described in coassigned U.S. patent application Ser. No. 08/235,011 (Attorney), entitled "Thin-Film Structure With Dense Array of Binary Control Units for Presenting Images" ("the Array Application"), incorporated herein by reference. Alternatively, each light control unit could receive a multi-level signal that can indicate three or more gray levels. In either case, continuity of data lines is important—a break in continuity may leave all of the light control units beyond the break in one of their saturation states, either fully ON or fully OFF, degrading presented images. Use of a smoothing layer over edges in lower layers can prevent this problem. The Array Application describes a working implementation that employs such a smoothing layer.

FIG. 6 shows a light control unit implemented in accordance with the Array Application. FIG. 6 shows several layers of a thin-film structure, with upper layers that are farthest from the substrate's surface obscuring lower layers.

The uppermost layer shown in FIG. 6 is a top metal layer, which forms data line 140 connected to a channel lead of a transistor in the light control unit; the top metal layer also forms several other features described below. The next layer shown is a layer of indium-tin-oxide (ITO), which forms transparent electrode 142. The next layer is a top nitride layer, which forms island 144, part of the transistor, and can also provide an insulator in a crossover region as discussed below. The lowest layer shown is a bottom metal layer, which forms gate line 146 and, connected to it, gate lead 148, which serves as the gate lead of the transistor.

Data line 140 can be implemented with a resistance of 0.2 ohm/sq. and can be driven at −8 V, 0 V, and ±8 V. Data line 140 provides a data signal to a column of binary control units, one of which is shown in FIG. 4. The part of data line 140 that extends over gate lead 148 connects to the source lead of the transistor.

Gate line 146 similarly provides a scan signal to a row of binary control units. Gate line 146 can be implemented with a resistance of 1.40 Ohm/Sq and can be driven at ±15 V and −15 V.

Data line 140 and gate line 146 are each 10 μm wide. Data line 140 crosses over gate line 146 in crossover region 150. Crossover region 150 can include an insulator formed by the top nitride layer, and other features as necessary to ensure that the two lines conduct signals adequately and that signals in the two lines are isolated and do not couple.

Transparent electrode 142 connects to the drain lead of the transistor through drain line 152, formed by the top metal layer. Therefore, when the transistor is conductive due to a scan signal provided to gate lead 148 by gate line 146, transparent electrode 142 receives and stores a drive signal from data line 140 through drain line 152.

Transparent electrode 142 also connects to charging lead 154, which implements one electrode of a storage capacitor and is formed by the top metal layer. Gate line 156, formed by the bottom metal layer, implements the other electrode of the storage capacitor; gate line 156 also provides a scan signal to the preceding binary control unit in the same column.

The Array Application describes in greater detail how array 100 can be implemented.

C.2. Middle ITO Process

Figure 7:
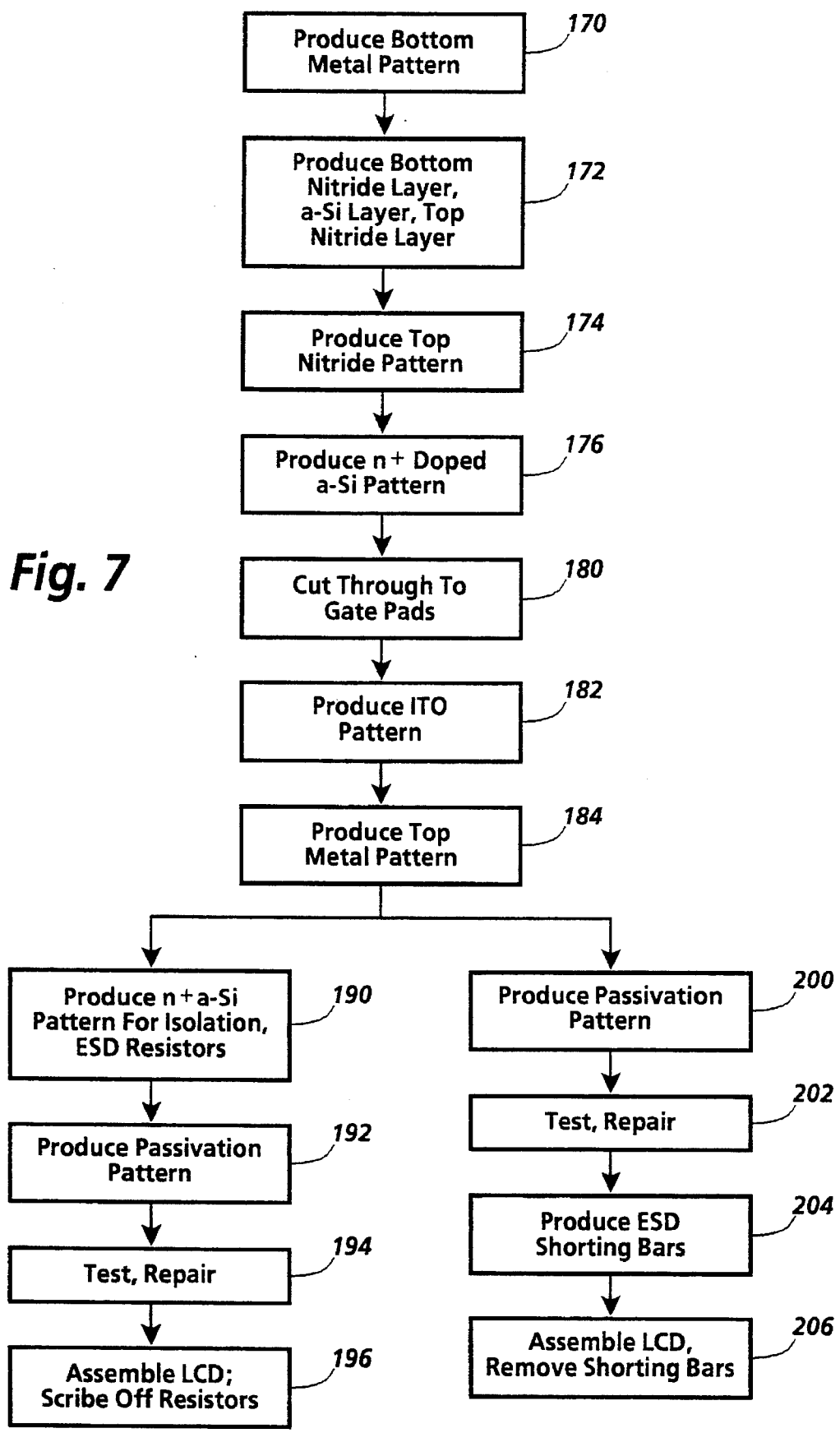
FIG. 7 is a flow chart showing acts in a process that can produce an array as in FIG. 5.
Figure 8:
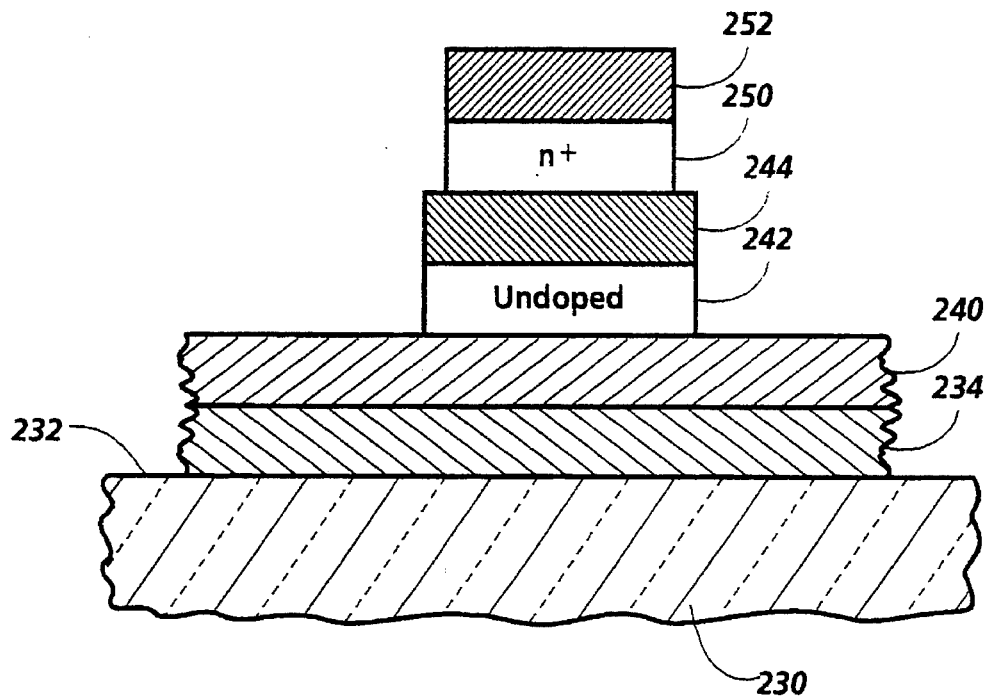
FIG. 8 is a cross-section of layers produced by the process of FIG. 7 in producing an array as in FIG. 5.
Figure 9:
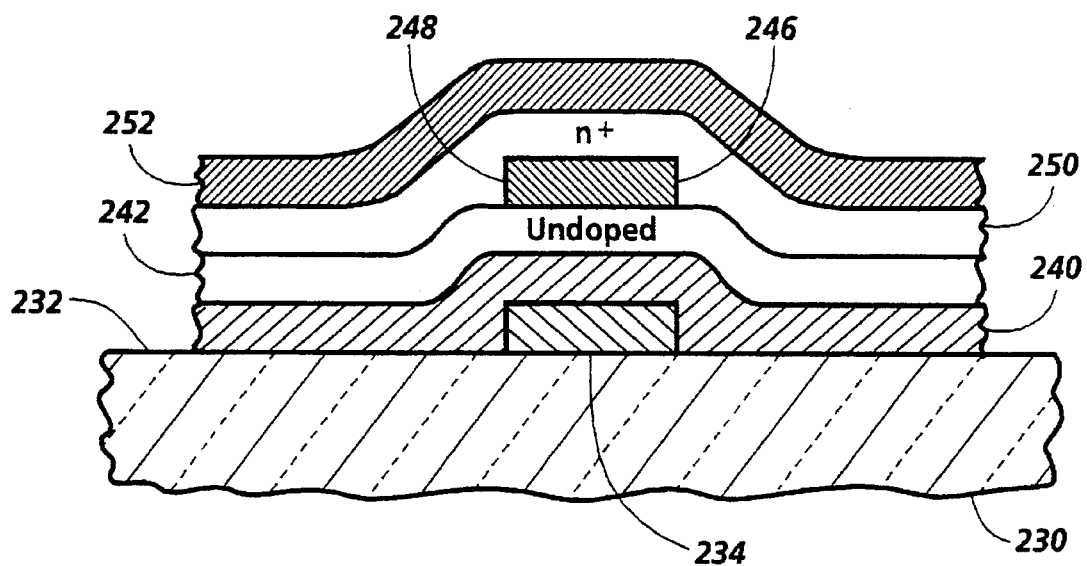
FIG. 9 is another cross-section of layers produced by the process of FIG. 7 in producing an array as in FIG. 5.

FIG. 7 shows acts in a process that can be used to produce an array with binary control units implementing the features of FIG. 6. FIG. 8 shows a cross-section along line A—A in FIG. 6 for a structure produced as in FIG. 7. FIG. 9 shows a cross-section along line B—B.

In FIG. 7, the act in box 170 begins by producing a bottom metal pattern that forms gate line 146 and gate lead 148 for each row of binary control units in an array and gate lead 148 for each binary control unit in each row. Each gate line 146 can have two pads, one at each end, for making connections to components off the substrate. The act in box 170 can be implemented by depositing metal using a physical vapor deposition process such as sputtering. A layer of photoresist can be applied, and a mask can then be used to cover areas in which metal is desired while the photoresist is exposed. The exposed photoresist can then be developed away to form a pattern of mask material over parts of the metal that are shaped like the scan lines. An etch appropriate to the metal can then remove the underlying metal in exposed areas, leaving the desired bottom metal pattern, from which the unexposed photoresist can be removed to prepare for subsequent layers.

Various specific techniques could be used to implement the act in box 170. In one working implementation, the bottom metal layer is 1500 angstroms thick and includes molybdenum and chromium, as described in copending, coassigned U.S. patent application Ser. No. 08/235,008 entitled "Thin-Film Structure with Conductive Molybdenum-Chromium Line," incorporated herein by reference. The bottom metal layer could be etched to obtain tapered gate lines as described in copending, coassigned U.S. patent application Ser. No. 08/235,010 entitled "Thin-Film Structure With Tapered Feature," incorporated herein by reference. Various other techniques could be used to produce the bottom metal layer, including techniques that provide a shunt layer such as titanium/tungsten over aluminum, techniques that provide alternating layers of aluminum to prevent hillock formation, and techniques that provide dielectric layers over an aluminum layer to flatten hillocks.

The act in box 172 then produces a bottom nitride layer, an amorphous silicon layer, and a top nitride layer. The act in box 172 has been implemented with plasma chemical vaper deposition (CVD) using a trilayer deposition or etch stop process that deposited three layers in sequence without breaking vacuum. The bottom nitride layer can be silicon nitride deposited at 300°–380° C. to obtain a refractive index of 1.87–1.97 and a thickness of 3000 angstroms. The amorphous silicon layer can be deposited at 230°–300° C. with 5–12% hydrogen, with a thickness of 300–500 angstroms. The top nitride layer can be silicon nitride deposited at 200°–250° C. to obtain a refractive index of 1.97–2.07 and a thickness of 1000–1500 angstroms. In a working implementation, a temperature of 380° C. was used for the bottom nitride, a temperature of 280° C. with 5% hydrogen for the amorphous silicon, and a temperature of 250° C. for the top nitride.

Because the amorphous silicon layer acts as an etch stop, subsequent etching can remove the top nitride layer without removing the amorphous silicon layer and the bottom nitride layer. The act in box 174 therefore forms a pattern of top nitride. In addition to island 144 as in FIG. 2, the top nitride pattern can include an insulating layer in crossover region 150 that is sufficiently thick that signals in data line 140 and gate line 146 are isolated and do not couple.

The act in box 174 can be implemented with a photoresist exposure process as described above in relation to box 170, using a wet etch with 10 parts water per part of HF for 2.5 minutes or until clear to obtain a non-self-aligned TFT with island 144 significantly smaller than the gate lead. In a working implementation, island is approximately 5 μm in width, approximately 16 pm in length, and its edge is between 5–8 pm from the edge of the gate lead, an arrangement that prevents light from the substrate side from causing leakage in the TFT's channel. Since the top nitride pattern includes only areas above gate line 146 and other gate lines, a backside exposure could also be used in combination with an appropriate mask to obtain a top nitride pattern that extends to the edge of the gate lead within the TFT. The backside exposure technique could be used to produce a self-aligned TFT, which could improve TFT performance by minimizing overlap of the top and bottom metal layers. In any event, the edge of the top nitride pattern should not be exactly aligned with edges of gate line 146, either in the TFT or in crossover 150. The act in box 174 can also include cleaning with a solution of 200 parts water per part of HF for 30–60 sec to prepare the array for deposition of another layer of amorphous silicon.

The act in box 176 then produces a pattern of n+ doped amorphous silicon, providing source and drain contacts. The act in box 176 can be implemented by first performing plasma CVD to deposit an n+ doped amorphous silicon layer at 200°–250° C. with 5–15% hydrogen to a thickness of 1000 angstroms. The amorphous silicon can be doped, for example, with 0.5–2% phosphorous, with 1% phosphorous being used in a working implementation. Then, a photoresist exposure process as described above in relation to box 170 can be used with a dry plasma etch using 10 parts CF4 per part of $O_2$ to remove the n+ layer and the undoped amorphous silicon layer from the area in which transparent electrode 142 will be formed, leaving only the bottom nitride on the substrate. In crossover region 150 and in other areas under data line 140, the n+ layer remains to form a smoothing layer so that data line 140 can be continuously formed over edges of the top nitride layer.

The act in box 180 cuts through layers deposited on the gate pads during the acts in boxes 172 and 176. The act in box 180 can be implemented with a photoresist exposure process as described above in relation to box 170, using an plasma etchant with 10 parts $CF_4$ per part of $O_2$. The act in box 180 can also make additional cuts to the gate lines for greater certainty of making metal-to-metal contact during subsequent steps.

The act in box 182 then produces an ITO pattern to form transparent electrode 142. The act in box 182 can be implemented by reactively sputter depositing a layer of ITO in 0.5–1.5% $O_2$ at room temperature to a thickness of 500–1000 angstroms. Then a photoresist exposure process as described above in relation to box 170 can be used with a wet etch of HCl to remove the ITO layer everywhere except transparent electrode 142. The mask used in this process can be the complement of the mask used in box 176, but with a slight bias so that the ITO layer is separated slightly from the n+ amorphous silicon layer. The remaining ITO layer can then be annealed at 200°–230° C. for an appropriate time period between one and three hours.

The act in box 184 produces a top metal pattern as shown in FIG. 6. The top metal layer can include a barrier layer and a conductive layer, with the barrier layer a metal that prevents diffusion of metal from the conductive layer into the n+ amorphous silicon layer. The barrier layer can include chromium or titanium-tungsten, deposited at a pressure that produces a low stress layer. The conductive layer can be aluminum, for example.

The act in box 184 can be implemented by sputter depositing, in sequence without breaking vacuum, 500 angstroms of titanium/tungsten, 3000–4000 angstroms of aluminum, and 500–1000 angstroms of titanium/tungsten. Another sequence would be 500 angstroms of chromium followed by 4000 angstroms of aluminum. The act in box 184 can also use a photoresist exposure process as described in relation to box 170 with a wet etch to remove the top metal layer except from data line 140, drain lead 142, charging lead 144, and the gate pads exposed in box 180. For the three layers of top metal, the etch can be done in three steps, first etching titanium/tungsten with $H_2O_2$, then etching aluminum with a standard aluminum etchant, and then again etching titanium/tungsten with $H_2O_2$. The top metal layer on the gate pads allows easier bonding.

The act in box 190 produces a pattern of the n+ layer remaining from box 176 in which the TFT leads are isolated and in which the n+ layer provides electrostatic damage (ESD) resistors between all adjacent gate and data pads at the perimeter of the array. The act in box 190 can be implemented with a photoresist exposure process as described in relation to box 170 with conventional dry plasma etching techniques with 10 parts $CF_4$ per part of $O_2$ to remove the n+ layer and the undoped amorphous silicon layer from the unmasked area. The mask need cover only the ESD resistors, since the top metal layer will prevent etching of n+ layer under it. The act in box 190 isolates data line 140, drain line 152, and charging lead 154, ensuring isolation of the three TFT leads from each other.

The act in box 192 provides a passivation pattern. The act in box 190 can be implemented by depositing a passivation layer of silicon oxy-nitride at 180°–210° C. with a refractive index of 1.7–1.8, to a thickness of 6000 angstroms. A working implementation used 190° C. The act in box 192 can use a photoresist exposure process as described in relation to box 170 with a plasma etch of 10 parts $CF_4$ to one part $O_2$ to remove the passivation layer from the data and gate pads.

The act in box 194 can then test the completed array, detecting and repairing any defective binary control units, any opens in scan or data lines, and any shorts between lines. Because the array is very dense, a few binary control units that are always OFF are not visible. For the same reason, magnification and other appropriate measures are necessary to detect defective binary control units. Once a defective binary control unit is detected, it can be repaired using a conventional laser repair station, such as from Photo Dynamics Inc., San Jose, Calif. or XMR Corp, Orange, Calif. The repair process can, for example, eliminate the electrical connection between gate line 146 and gate lead 148. Similarly, an open can be repaired by depositing a conductive layer across it and a short can be repaired by cutting scan lines on either side of the short.

Finally, the act in box 196 can then assemble a liquid crystal display (LCD), scribing off the ESD resistors after the LCD is assembled. ESD structures such as resistors are necessary for an active matrix liquid crystal display (AMLCD) because, during assembly, a thin layer of polyimide, approximately 100 angstroms, is buffed or rubbed before gluing. As a result, when the liquid crystal fills the cavity through capillary action, it is aligned. ESD structures prevent any resulting electrostatic charge from destroying the circuitry. Rather than using ESD resistors, which must be scribed and broken off after assembly, ESD shorting bars could be deposited between all adjacent pads after the act in box 120; the ESD shorting bars could be removed by wet etching after assembly, as shown at right in FIG. 7.

The act in box 200 produces a passivation pattern similarly to box 192. The act in box 202 then tests and repairs as in box 194. The act in box 204, however, produces ESD shorting bars. Then, the act in box 206 assembles an LCD, removing the shorting bars after a successful assembly.

FIGS. 8 and 9 show cross-sections along lines A—A and B—B in FIG. 6, respectively, for a thin-film structure produced using the process in FIG. 7. Layers of the same material are similarly shaded and bear the same reference number in the two drawings. Additional cross-sections along other lines in FIG. 6 are described in the Array Application, incorporated herein by reference.

Substrate 230 has surface 232 at which a thin-film structure is formed, beginning with bottom metal layer 234 which gate line 146 in FIG. 6. Over bottom metal layer 234 is bottom nitride layer 240, followed by undoped amorphous silicon layer 242. Over amorphous silicon layer 242 is top nitride layer 244, with edges 246 and 248 shown in FIG. 9. Over top nitride layer 244 where it exists and over amorphous silicon layer 242 elsewhere is n+ amorphous silicon layer 250. Over n+ layer 250 is top metal layer 252. Over top metal layer 252 and other exposed layers can be a passivation layer (not shown).

Substrate 230 can be Corning 7059 Glass with the same coefficient of thermal expansion as n+amorphous silicon layer 250 if deposited by plasma enhanced CVD. Matching the coefficients of thermal expansion may result in tolerable stress on top metal layer 252. In addition, the edges of n+ layer 250 are aligned with the edges of top metal layer 252, because layer 252 is used as a mask pattern in etching layer 250.

C.3. Top and Bottom ITO Processes

The process in FIG. 7 is only one of many processes that could be used to implement the layout of FIG. 6. Other examples that could be used are described in copending, coassigned U.S. patent applications Ser. No. 08/235,009 entitled "Electrically Isolated Pixel Element in a Low Voltage Activated Active Matrix Liquid Crystal Display and Method," and 08/233,190, entitled "Pixel Structure Having a Bottom-Layered Pixel Element for an Active Matrix Liquid Crystal Display and Method," both incorporated herein by reference. These alternative processes would produce layers like those shown in FIGS. 8 and 9.

C.4. Variations

The implementations described above employ Corning 7059 Glass as a substrate, but other glass substrates or non-glass substrates, such as quartz or ceramic, could be used.

The implementations described above generally include homogeneous layers, but layers could include multiple sublayers or could include layers that vary in composition.

D. Application

The invention could be applied in many ways, including AMLCD arrays and other arrays with orthogonal conductive lines that cross. Some examples are described in the Array Application, incorporated by reference above.

E. Miscellaneous

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. A product comprising:

a substrate that has a surface; and a thin-film structure formed at the surface of the substrate; the thin-film structure comprising:

first and second conductive lines;

first and second leads for connecting components to be second conductive line at first and second connecting points; the second conductive line extending between the first and second connecting points; the second conductive line crossing over the first conductive line in a crossover region between the first and second connecting points so that the first conductive line is between the second conductive line and the surface of the substrate in the crossover region; the first conductive line having an edge in the crossover region;

a first insulating layer between the second conductive line and the surface and the substrate; the first insulating layer being between the first and second conductive lines in the crossover region so that the first insulating layer covers the first conductive line;

a second insulating layer between the first insulating layer and the second conductive line in the crossover region; the second insulating layer being sufficiently thick that signals in the first and second conductive lines are isolated from each other and do not couple; the second insulating layer having an edge under the second conductive line between the first and second connecting points; and a smoothing layer under the second conductive line between the first and second connecting points; the smoothing layer being between the second insulating layer and the second conductive line in the crossover region; the smoothing layer having an outer surface shaped so that the second conductive line is continuously formed over the edge of the first conductive line and over the edge of the second insulating layer and so that the second conductive line electrically connects the first and second leads.

2. The product of claim 1 in which the smoothing layer extends continuously without an edge between the first and second connecting points.

3. The product of claim 1 in which the second conductive line comprises aluminum.

4. The product of claim 1 in which the first conductive line extends in a first direction and the second conductive line extends in a second direction; the first conductive line having a first line width in the second direction in the crossover region and having two edges extending in the first direction in the crossover region; the second insulating layer having a width in the second direction approximately equal to the first line width; the second insulating layer having two edges extending in the first direction in the crossover region; the edges of the second insulating layer being slightly offset from the edges of the first conductive line; the smoothing layer's outer surface being shaped so that the second conductive line is continuously formed over the two edges of the first conductive line and over the two edges of the second insulating layer.

5. The product of claim 4 in which the second conductive line has a second line width in the first direction in the crossover region and has two edges extending in the second direction in the crossover region; the second insulating layer having a width in the first direction approximately equal to the second line width; the second insulating layer further having two edges extending in the second direction in the crossover region; the second insulating layer's two edges extending in the second direction being slightly offset from the edges of the second conductive line.

6. The product of claim 4 in which the first and second insulating layers each comprise silicon nitride.

7. The product of claim 6 in which the first insulating layer is approximately 3000 angstroms thick and the second insulating layer is approximately 1500 angstroms thick.

8. The product of claim 6, further comprising a layer of amorphous silicon between the first and second insulating layers.

9. The product of claim 8 in which the layer of amorphous silicon is approximately 500 angstroms thick.

10. The product of claim 1 in which the substrate is an insulator; the first conductive line being on the substrate.

11. The product of claim 10 in which the first conductive line comprises molybdenum and chromium.

12. A product comprising:

a substrate that has a surface; and a thin-film structure formed at the surface of the substrate; the thin-film structure comprising:

first and second conductive lines;

first and second leads for connecting components to the second conductive line at first and second connection points; the second conductive line extending between the first and second connecting points; the second conductive line crossing over the first conductive line in a crossover region between the first and second connecting points so that the first conductive line is between the second conductive line and the surface of the substrate in the crossover region; the first conductive line having edge in the crossover region; the second conductive line having edges;

a first layer between the second conductive line and the surface of the substrate; the first insulating layer being between the first and second conductive lines in the crossover region so that the first insulating layer covers the first conductive line; and a smoothing layer under the second conductive line between the first and second connecting points; the smoothing layer being between the first insulating layer and the second conductive line in the crossover region; the smoothing layer having an outer surface shaped so that the second conductive line is continuously formed over the edge of the first conductive line and electrically connects the first and second leads; the smoothing layer having edges aligned with the second conductive line's edges.

13. A product comprising:

a substrate that has a surface; and a thin-film structure formed at the surface of the substrate; the thin-film structure comprising:

first and second conductive lines;

first and second leads for connecting components to the second conductive line at first and second connecting points; the second conductive line extending between the first and second connecting points; the second conductive line crossing over the first conductive line in a crossover region between the first and second connecting points so that the first conductive line is between the second conductive line and the surface of the substrate in the crossover region; the first conductive line having an edge in the crossover region;

a first insulating layer between the second conductive line and the surface of the substrate; the first insulating layer being between the first and second conductive lines in the crossover region so that the first insulating layer covers the first conductive line; and a smoothing layer under the second conductive line between the first and second connecting points; the smoothing layer being between the first insulating layer and the second conductive line in the crossover region; the smoothing layer having an outer surface shaped so that the second conductive line is continuously formed over the edge of the first conductive line and electrically connects the first and second leads; the smoothing layer comprising amorphous silicon.

14. The product of claim 13 in which the smoothing layer further comprises a dopant in the amorphous silicon.

15. The product of claim 14 in which the dopant is an n+ dopant.

16. The product of claim 13 in which the second conductive line comprises:

a sublayer of conductive metal; and a sublayer of barrier metal between the smoothing layer and the sublayer of conductive metal to prevent the conductive metal from diffusing into the smoothing layer.

17. The product of claim 13 in which the amorphous silicon is deposited by chemical vapor deposition.

18. The product of claim 13 in which the smoothing layer is deposited by plasma enhanced chemical vapor deposition.

19. A method of forming a thin-film structure at a surface of a substrate; the method comprising:

producing a first conductive line that has an edge;

producing an insulating layer so that the first conductive line is between the insulating layer and the surface of the substrate; the insulating layer being wider than the first conductive line so that the insulating layer covers the edge of the first conductive line;

producing a smoothing layer si that the insulating layer and the first conductive line are between the smoothing layer and the surface of the substrate; the smoothing layer having an outer surface facing away from the surface of the substrate; the smoothing layer extending over the edge of the first conductive line;

producing a conductive layer so that the smoothing layer is between the conductive layer and the insulating layer;

performing lithography to produce a pattern of mask material; the pattern covering a part of the conductive layer, the covered part being shaped like a conductive line extending between two connecting points; the covered part of the conductive layer extending across the first conductive line in a crossover region; the region including the edge of the first conductive line;

etching to remove area of the conductive layer not covered by the pattern of mask material so that the covered part of the conductive layer remains; the covered part forming a second conductive line that cross over the first conductive line in the crossover region; and etching to remove area of the smoothing layer not covered by the second conductive line;

the act of producing the smoothing layer producing its outer surface shaped so that the act of producing the conductive layer produces the conductive layer continuously formed over the edge of the first conductive line; the second conductive line electrically connecting the first and second connecting points.

20. A product comprising:

a substrate that has a surface; and a thin-film structure formed at the surface of the substrate; the thin-film structure comprising:

first and second conductive lines;

first and second leads for connecting components to the second conductive line at first and second connecting points; the second conductive line extending between the first and second connecting points; the second conductive line crossing over the first conductive line in a crossover region between the first and second connecting points so that the first conductive line is between the second conductive line and the surface of the substrate in the crossover region; the first conductive line having an edge in the crossover region;

a first insulating layer between the second conductive line and the surface of the substrate; the first insulating layer being between the first and second conductive lines in the crossover region so that the first insulating layer covers the first conductive line; and a smoothing layer under the second conductive line between the first and second connecting points; the smoothing layer being between the first insulating layer and the second conductive line in the crossover region; the smoothing layer having an outer surface shaped so that the second conductive line is continuously formed over the edge of the first conductive line and electrically connects the first and second leads; the smoothing layer having a coefficient of thermal expansion approximately equal to the substrate's coefficient of thermal expansion.

21. The product of claim 20 in which the substrate is glass and the smoothing layer is amorphous silicon.

22. A method of forming a thin-film structure at a surface of a substrate; the method comprising:

producing a first conductive line that has an edge;

producing an insulating layer so that the first conductive line is between the insulating layer and the surface of the substrate; the insulating layer being wider than the first conductive line so that the insulating layer covers the edge of the first conductive line;

producing a smoothing layer so that the insulating layer and the first conductive line are between the smoothing layer and the surface of the substrate; the smoothing layer having an outer surface facing away from the surface of the substrate; the smoothing layer extending over the edge of the first conductive line; the smoothing layer being n+ doped amorphous silicon; the act of producing the smoothing layer comprising performing chemical vapor deposition;

producing a conductive layer so that the smoothing layer is between the conductive layer and the insulating layer;

performing lithography to produce a pattern of mask material; the pattern covering a part of the conductive layer, the covered part being shaped like a conductive line extending between two connecting points; the covered part of the conductive layer extending across the first conductive line in a crossover region; the region including the edge of the first conductive line; and etching to remove areas of the conductive layer not covered by the pattern of mask material so that the covered part of the conductive layer remains; the covered part forming a second conductive line that crosses over the first conductive line in the crossover region;

the act of producing the smoothing layer producing its outer surface shaped so that the act of producing the conductive layer produces the conductive layer continuously formed over the edge of the first conductive line; the second conductive line electrically connecting the first and second connecting points.

23. A product comprising:

a substrate that has a surface; and a thin-film structure formed at the surface of the substrate; the thin-film structure comprising:

an array of light control units for causing presentation of images; each light control unit having a scan lead for receiving a scan signal and a drive lead for receiving a drive signal; each light control unit responding to its scan and drive signals by causing presentation of a segment of images presented by the array;

first and second sets of conductive lines; each conductive line in the first set extending in a first direction and being connected to the scan lead of each of a set of the light control units for providing a scan signal to the light control units in the set; each conductive line in the second set extending in a second direction and being connected to the drive lead of each of a set of the light control units for providing a drive signal to the light control units in the set; the first and second directions not being parallel; each conductive line in the second set crossing over each conductive line in the first set in a crossover region so that, in each crossover region, one of the conductive lines in the first set is between one of the conductive lines in the second set and the substrate; in each crossover region, one of the conductive lines in the first set having an edge;

an insulating layer between the conductive lines in the second set and the surface of the substrate; the insulating layer being between the conductive line in the second set and the conductive line in the first set in each crossover region so that the insulating layer covers the conductive line in the first set; and a smoothing layer under each conductive line in the second set between each pair of adjacent points at which the conductive line connects to drive leads; the smoothing layer being between the insulating layer and the conductive line in the second set in each crossover region; the smoothing layer having an outer surface shaped so that each conductive line in the second set is continuously formed over the edge of each conductive line in the first set between each pair of adjacent points at which the conductive line in the second set connects to drive leads; the smoothing layer comprising amorphous silicon.

24. The product of claim 23 in which the array has a diagonal dimension of approximately 33 cm and an area of approximately 510 cm$^2$.

25. The product of claim 23 in which each light control unit comprises:

a thin-film transistor having a gate lead and a source lead; the gate lead being the scan lead for receiving the scan signal; the scan signal provided by each conductive line in the first set selecting the light control units in the set connected to the conductive line; the source lead being the drive lead for receiving the drive signal; the drive signal provided by each conductive line in the second set being provided to the light control units in the set connected to the conductive line so that one of the light control units that is also in the set selected by the scan signal receives the drive signal;

the light control units in the array forming rows and columns, each row extending in a first direction and each column extending in a second direction;

the set of light control units connected to each conductive line in the first set including the light control units in a row;

the set of light control units connected to each conductive line in the second set including the light control units in a column.

* * * * *

UNITED STATES PATENT AND TRADEMARK OFFICE
CERTIFICATE OF CORRECTION

| | |
|---|---|
| PATENT NO. | : 5,486,939 |
| APPLICATION NO. | : 08/234885 |
| DATED | : January 23, 1996 |
| INVENTOR(S) | : Ronald T. Fulks |

It is certified that error appears in the above-identified patent and that said Letters Patent is hereby corrected as shown below:

Column 13, claim 1, should read:
CLAIM:

1. A product comprising:
a substrate that has a surface; and
a thin-film structure formed at the surface of the substrate;
    the thin-film structure comprising:
    first and second conductive lines;
first and second leads for connecting components to [[be]] the second conductive line at first and second connecting points; the second conductive line extending between the first and second connecting points; the second conductive line crossing over the first conductive line in a crossover region between the first and second connecting points so that the first conductive line is between the second conductive line and the surface of the substrate in the crossover region; the first conductive line having an edge in the crossover region;
a first insulating layer between the second conduvtive line and the surface and the substrate; the first insulating layer being between the first and second conductive lines in the crossover region so that the first insulating layer covers the first conductive line;
a second insulating layer between the first insulating layer and the second conductive line in the crossover region; the second insulating layer being sufficiently thick that signals in the first and second conductive lines are isolated from each other and do not couple; the second insulating layer having an edge under the second conductive line between the first and second connecting points; and
a smoothing layer under the second conductive line between the first and second connecting points; the smoothing layer being between the second insulating layer and the second conductive line in the crossover region; the smoothing layer having an outer surface shaped so that the second conductive line is continuously formed over the edge of the first conductive line and over the edge of the second insulating layer and so that the second conductive line electrically connects the first and second leads.

Column 14, Claim 12 should read:

12. A product comprising:
a substrate that has a surface; and
a thin-film structure formed at the surface of the substrate; the thin-film structure comprising:
first and second conductive lines:

UNITED STATES PATENT AND TRADEMARK OFFICE
CERTIFICATE OF CORRECTION

PATENT NO. : 5,486,939
APPLICATION NO. : 08/234885
DATED : January 23, 1996
INVENTOR(S) : Ronald T. Fulks It is certified that error appears in the above-identified patent and that said Letters Patent is hereby corrected as shown below:

first and second leads for connecting components to the second conductive line at first and second ~~connection~~ <u>connecting</u> points; the second conductive line extending between the first and second connecting points; the second conductive line crossing over the first conductive line in a crossover region between the first and second connecting points so that the first conductive line is between the second conductive line and the surface of the substrate in the crossover region; the first conductive line having edge in the crossover region; the second conductive line having edges;

a first <u>insulating</u> layer between the second conductive line and the surface of the substrate; the first insulating layer being between the first and second conductive lines in the crossover region so that the first insulating layer covers the first conductive line; and a smoothing layer under the second conductive line between the first and second connecting points; the smoothing layer being between the first insulating layer and the second conductive line in the crossover region; the smoothing layer having an outer surface shaped so that the second conductive line is continuously formed over the edge of the first conductive line and electrically connects the first and second leads; the smoothing layer having edges aligned with the second conductive line's edges.

Column 15, Claim 19 should read:

19. A method of forming a thin-film structure at a surface of a substrate; the method comprising: producing a first conductive line that has an edge;

producing an insulating layer so that the first conductive line is between the insulating layer and the surface of the substrate; the insulating layer being wider than the first conductive line so that the insulating layer covers the edge of the first conductive line;

producing a smoothing layer [[si]] <u>so</u> that the insulating layer and the first conductive line are between the smoothing layer and the surface of the substrate; the smoothing layer having an outer surface facing away from the surface of the substrate; the smoothing layer extending over the edge of the first conductive line;

producing a conductive layer so that the smoothing layer is between the conductive layer and the insulating layer;

performing lithography to produce a pattern of mask material; the pattern covering a part of the conductive layer, the covered part being shaped like a conductive line extending between two connecting points; the covered part of the conductive layer extending across the first conductive line in a crossover region; the region including the edge of the first conductive line;

UNITED STATES PATENT AND TRADEMARK OFFICE
CERTIFICATE OF CORRECTION

PATENT NO. : 5,486,939
APPLICATION NO. : 08/234885
DATED : January 23, 1996
INVENTOR(S) : Ronald T. Fulks It is certified that error appears in the above-identified patent and that said Letters Patent is hereby corrected as shown below:

etching to remove ~~area~~ areas of the conductive layer not covered by the pattern of mask material so that the covered part of the conductive layer remains; the coverd part forming a second conductive line that cross over the first conductive line in the crossover region; and etching to remove ~~area~~ areas of the smoothing layer not covered by the second conductive line;

the act of producing the smoothing layer producing its outer surface shaped so that the act of producing the conductive layer produces the conductive layer continuously formed over the edge of the first conductive line; the second conductive line electrically connecting the first and second connecting points.

Signed and Sealed this

Thirty-first Day of July, 2007

JON W. DUDAS
*Director of the United States Patent and Trademark Office*